United States Patent
Cheng et al.

(10) Patent No.: US 9,985,107 B2
(45) Date of Patent: May 29, 2018

(54) METHOD AND STRUCTURE FOR FORMING MOSFET WITH REDUCED PARASITIC CAPACITANCE

(71) Applicant: International Business Machines Corporation, Armonk, NY (US)

(72) Inventors: Kangguo Cheng, Schenectday, NY (US); Peng Xu, Guilderland, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/196,591

(22) Filed: Jun. 29, 2016

(65) Prior Publication Data
US 2018/0006128 A1    Jan. 4, 2018

(51) Int. Cl.
| | |
|---|---|
| *H01L 29/51* | (2006.01) |
| *H01L 29/78* | (2006.01) |
| *H01L 29/66* | (2006.01) |
| *H01L 23/532* | (2006.01) |
| *H01L 21/8234* | (2006.01) |

(52) U.S. Cl.
CPC ...... *H01L 29/51* (2013.01); *H01L 21/823468* (2013.01); *H01L 23/5329* (2013.01); *H01L 29/6653* (2013.01); *H01L 29/66689* (2013.01); *H01L 29/66795* (2013.01); *H01L 29/785* (2013.01)

(58) Field of Classification Search
CPC . H01L 29/51; H01L 23/5329; H01L 29/6653; H01L 29/66795; H01L 29/785; H01L 29/66689; H01L 21/823468
See application file for complete search history.

(56) References Cited

U.S. PATENT DOCUMENTS

| | | | |
|---|---|---|---|
| 6,194,748 B1 * | 2/2001 | Yu | H01L 21/28194 257/216 |
| 8,450,178 B2 | 5/2013 | Cheng et al. | |
| 8,524,592 B1 * | 9/2013 | Xie | H01L 29/78 257/387 |
| 9,129,987 B2 | 9/2015 | Wan et al. | |
| 9,589,806 B1 * | 3/2017 | Bao | H01L 21/283 |
| 2002/0011613 A1 * | 1/2002 | Yagishita | H01L 21/28194 257/284 |
| 2002/0171107 A1 * | 11/2002 | Cheng | H01L 29/6656 257/347 |
| 2010/0270627 A1 | 10/2010 | Chang et al. | |
| 2011/0081774 A1 | 4/2011 | Yeh et al. | |

(Continued)

OTHER PUBLICATIONS

C. H. Ko et al., "A Novel CVD-SiBCN low-K Spacer Technology for High-speed Applications." Symposium on VLSI Technology, 2008, pp. 108-109.

*Primary Examiner* — Fei Fei Yeung Lopez
(74) *Attorney, Agent, or Firm* — Vazken Alexanian; McGinn IP Law Group, PLLC (57) ABSTRACT

A method (and structure) of fabricating an MOSFET (metal-oxide-semiconductor field-effect transistor), includes, on a gate structure coated with a high-k sidewall spacer film, etching off the high-k sidewall spacer film from a top surface of the gate structure and from a portion of vertical walls of the gate structure. The etched-off high-k sidewall spacer film on the vertical walls is replaced with an ultra low-k material.

6 Claims, 13 Drawing Sheets

(56) References Cited

U.S. PATENT DOCUMENTS

| | | | |
|---|---|---|---|
| 2012/0146053 A1* | 6/2012 | Saitoh | H01L 29/66795 257/77 |
| 2012/0187497 A1* | 7/2012 | Zhong | H01L 21/82343 257/368 |
| 2013/0187229 A1 | 7/2013 | Cheng et al. | |
| 2013/0252430 A1 | 9/2013 | Ranjan et al. | |
| 2013/0270655 A1 | 10/2013 | Adam et al. | |
| 2013/0307087 A1 | 11/2013 | Xie et al. | |
| 2014/0054717 A1* | 2/2014 | Edge | H01L 21/28088 257/369 |
| 2014/0138779 A1* | 5/2014 | Xie | H01L 29/66545 257/401 |
| 2014/0295637 A1* | 10/2014 | Mehta | H01L 29/6653 438/300 |
| 2015/0187945 A1* | 7/2015 | Kamineni | H01L 29/785 257/384 |
| 2015/0311083 A1 | 10/2015 | Xiao et al. | |

\* cited by examiner

METHOD AND STRUCTURE FOR FORMING MOSFET WITH REDUCED PARASITIC CAPACITANCE

BACKGROUND

The present invention relates to MOSFET devices, and more specifically, the formation of an ultra low-k film between the gate and source/drain contacts reduces the gate-source and gate-drain parasitic capacitances.

Figure 1:
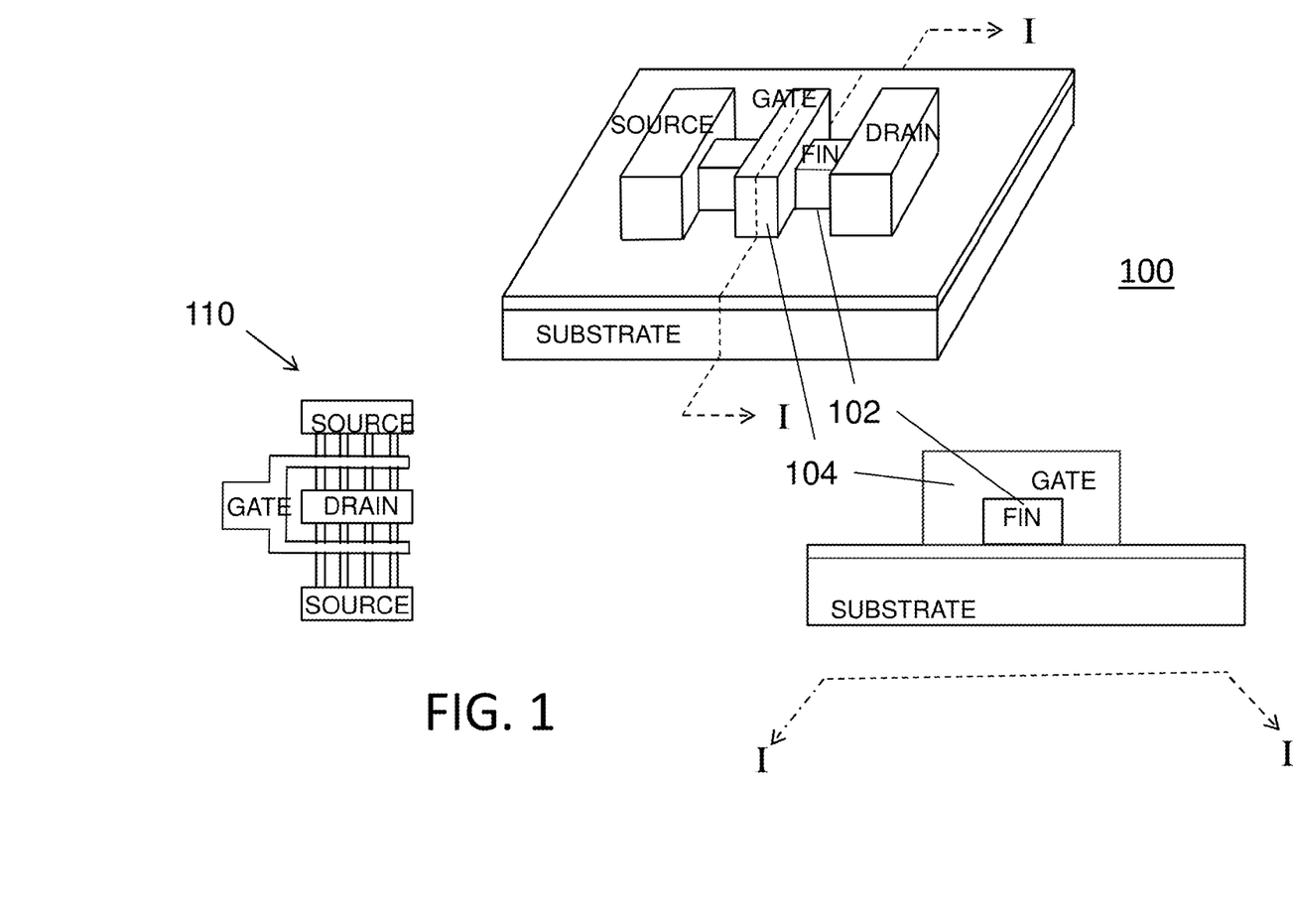
FIG. 1 illustrates exemplary conventional finFET structure 100.

FIG. 1 shows exemplarily a finFET (Fin Field Effect Transistor) 100, a type of non-planar transistor used in many modern processor designs. It can be fabricated on an SOI (silicon on insulator) substrate or on a Si (silicon) substrate and is characterized by one or more fin structures 102 that form the conductive channel controlled by the gate structure 104. This fin-shaped structure permits multiple gates to operate on a single transistor, such as demonstrated by structure 110, and permits devices that are smaller, faster, and more energy efficient.

The present inventors have recognized that the shrinking of the finFET structure results in an undesired relatively high parasitic capacitance between the gate and source/drain contacts and have identified various factors in the conventional fabrication of finFET devices that contribute to this high parasitic capacitance, as follows. First, the shrinking of the gate pitch limits the spacer thickness, and a thinner spacer provides a capacitor structure with higher capacitance. Additionally, an etchant that is selective to the material used for the spacer limits the options for the spacer material. Finally, the spacer is often damaged during the contact open stage of fabrication, which is the fabrication stage during which the source and drain regions are exposed for metal deposition for contacts.

The present invention discloses a novel flow and unique structure to resolve the above-identified issues. Although the following discussion uses the finFET for purpose of explanation, the present invention is not intended as limited specifically to finFET structures since it is equally applicable to any MOSFET-like structure having a gate structure with spacers to separate the gate from the source/drain structures.

SUMMARY

Figure 2:
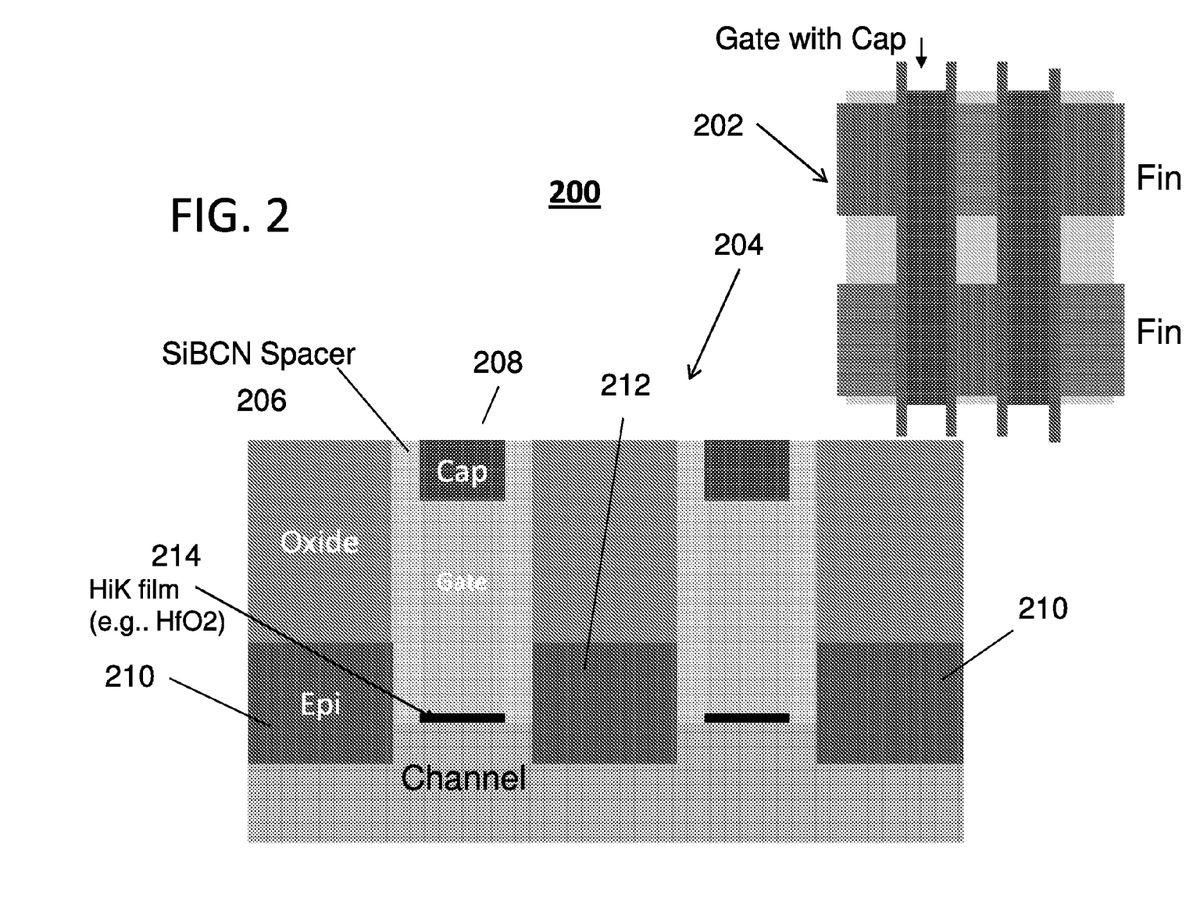
FIG. 2 shows additional details 200 of the conventional finFET structure from a plan view 202 and cross-sectional view 204, for purpose of explaining the present invention.

FIG. 2 shows an exemplary conventional finFET structure 200, from a plan view 202 and from a cross-sectional view 204, after the post gate cap polish (CMP). As shown in the cross-sectional view 204, the conventional structure includes SiBCN (Silicon-Boron-Carbon-Nitride) thin film gate spacers 206, which material has a high-k characteristic, as does the high-k film (e.g., high impedance film layer) 214 underlying the gate structure 208 and comprising $HfO_2$. The present inventors have recognized that such high-k material inherently results in a higher parasitic capacitance between the gate structure 208 and source/drain structures 210,212 (source/drain epitaxial regions) than would result if the spacer material had different characteristics. However, SiBCN is conventionally used because its thermal characteristics support the initial formation of the gate structures.

Accordingly, the present invention teaches to modify the conventional gate spacers 206 having high-k composition to at least partially replace this film with a material having an ultra low-k characteristic. Such modification decreases the dielectric characteristic so that this modified gate spacer can no longer serve as efficiently as a capacitor, thereby decreasing its parasitic capacitance.

DETAILED DESCRIPTION

Figure 3:
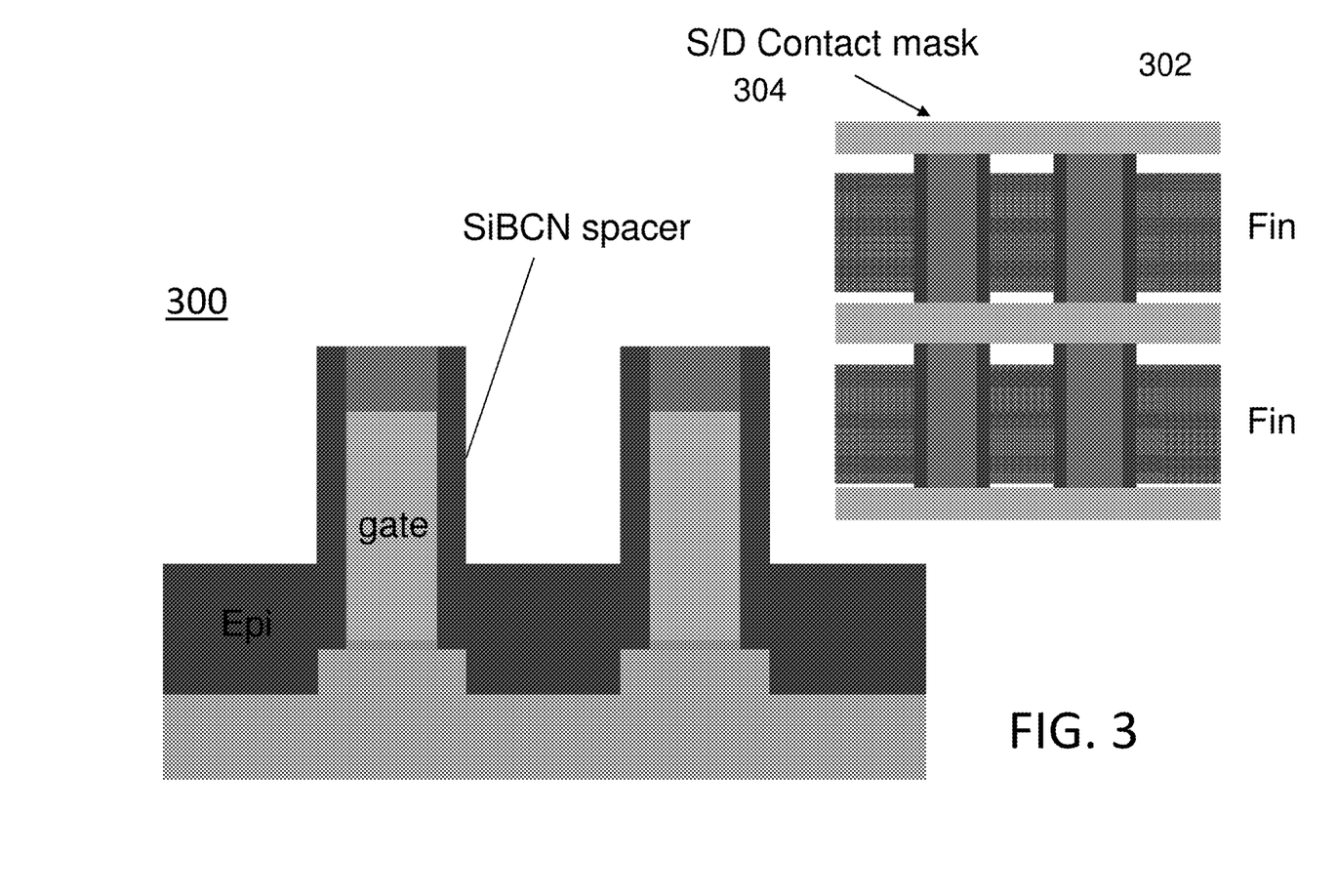
FIG. 3 illustrates a cross-sectional view 300 of the source/drain contact open mask stage of fabricating a finFET in accordance with concepts of the present invention.

With reference now beginning with FIG. 3, two exemplary embodiments will now be explained for finFETs. As mentioned above, the present invention is also applicable in other devices, such as MOS-like devices, having spacer elements separating a gate structure from the source/drain. FIG. 3 shows a cross-sectional view 300 and plan view 302 at the stage that the oxide layer 214 of conventional device shown in FIG. 2 has been etched in preparation for the the source/drain contact open mask 304, using, for example, an oxide RIE (reactive ion etch).

Figure 4:
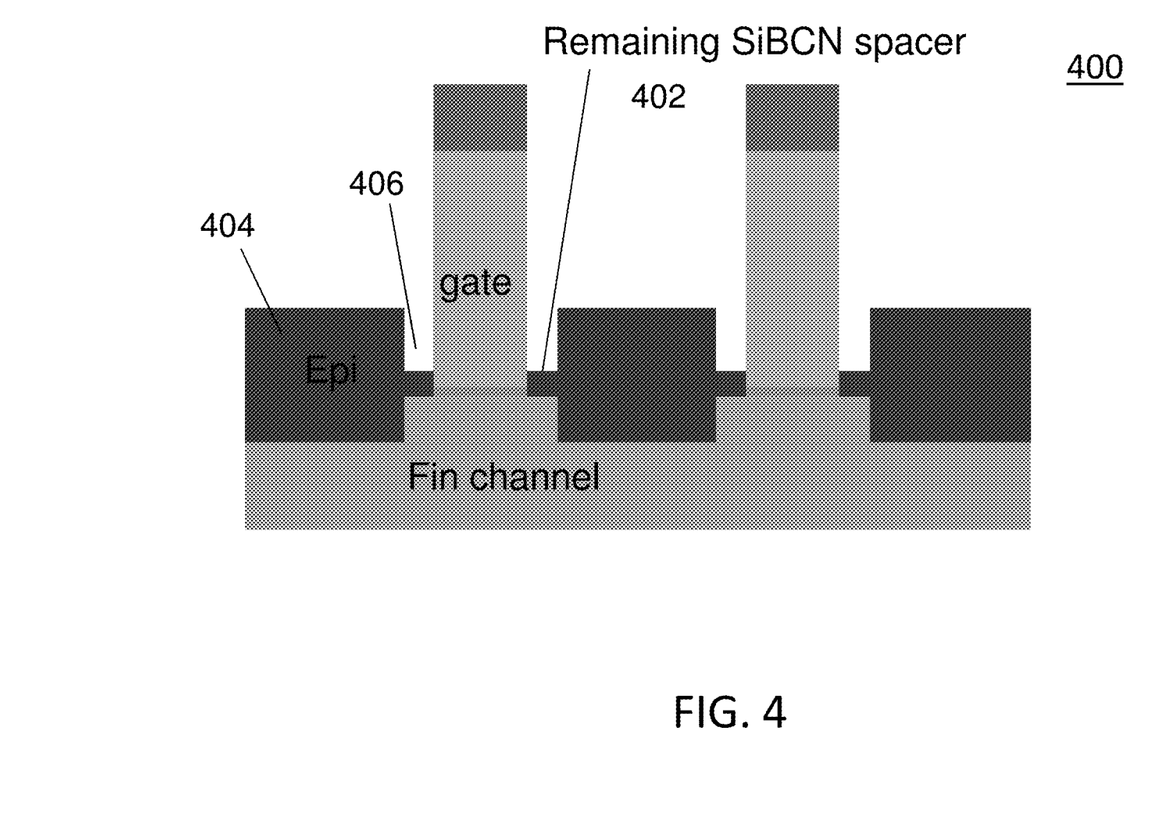
FIG. 4 illustrates a cross-sectional view 400 after an isotropic etch to remove portions of SiBCN gate sidewalls.

A first exemplary embodiment will be explained beginning with FIG. 4. A characteristic feature of this first exemplary embodiment is that a top of a residual of the SiBCN spacer 402 extends below the top of epi layer 404. As shown in FIG. 4, the first step of this first embodiment is an etch of the exposed SiBCN spacer (306 in FIG. 3), so as to create a divot 406 (e.g., a cavity or space) between the gate and source/drain at the epi layer 404, by over-etch. The etch of the SiBCN can be implemented either as an isotropic etch or as an RIE (reactive ion etch). A portion of the SiBCN layer remains above the fin in order to protect the gate structure during the downstream processes described shortly by inadvertently permitting the fin to contact either the gate dielectric or metal gate.

The divot 406 is a high-aspect-ratio structure. Therefore, during spacer material deposition using an ultra low-k material and as exemplarily shown in FIG. 5, it is easy to pinch off the divot on its top area to trap an air gap inside the divot space. This pinch-off characteristic, with its associated air pocket remaining inside the divot cavity, is intentional in the first exemplary embodiment, since it avoids having to use additional steps to completely fill in the etched-out space, while providing an ultra low-k value for this vacated region between the gate and the source/drain epi regions, since air also provides an ultra low-k value close to 1.

Figure 5:
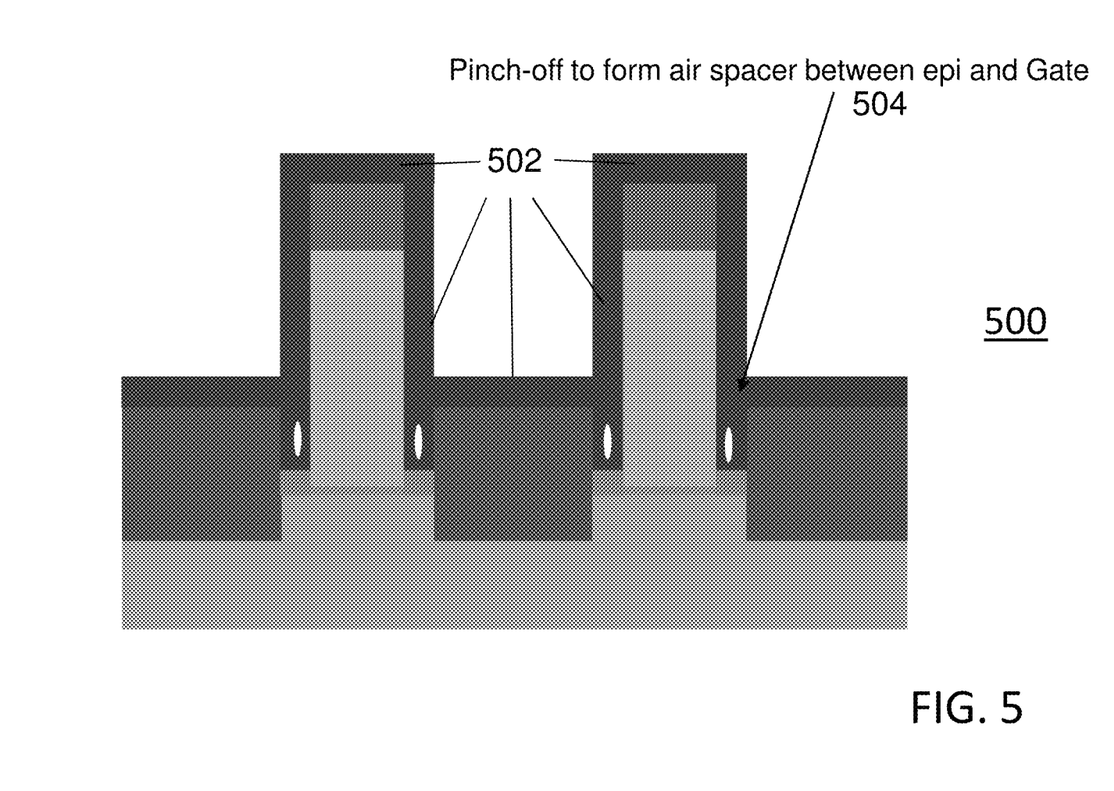
FIG. 5 illustrates a cross-sectional view 500 after deposition of the ultra low-k film.

FIG. 5 shows the structure 500 after the ultra low-k film 502 deposition, including air spacer 504 resultant from the divot pinch-off effect. Unlike the original SiBCN spacer (k-value is around 5), ultra low-k material, for example SiCOH (a thin film comprising silicon Si, carbon C, oxygen O, and hydrogen H and having a k-value of approximately 2.5), is deposited as a partial substitute spacer material 502. Such ultra low-k materials can be used because there is no more high thermal budget (e.g., source/drain dopant and activation anneal) required for the BEOL (Back End of the Line) processing of the devices, nor is any more aggressive cleaning (epi preclean) needed.

Figure 6:
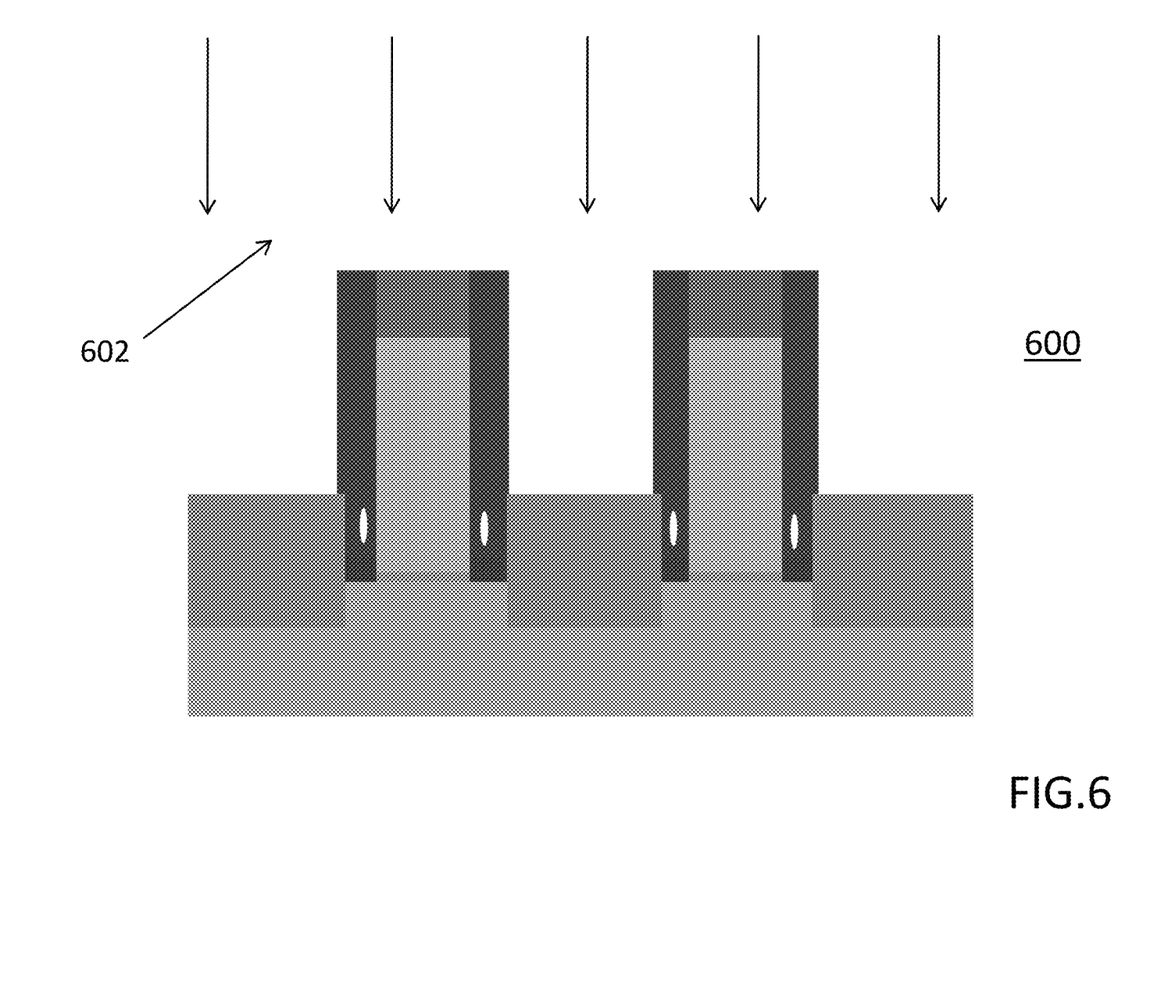
FIG. 6 illustrates a cross-sectional view 600 after a vertical etch 602 of the ultra low-k film.

The first embodiment is characterized by air spacers 504 between the epi layer and the gate, and the combination of the air space with k≈1 and SiCOH with k≈2.5 provides an ultra low-k gate spacer that reduces the gate/source/drain parasitic capacitance. Other possible (non-limiting) examples of ultra low-k materials would be organosilica glasses (OSG), porous xerogel, or mesoporous silica films (MCM). In FIG. 6, an RIE (reactive ion etch) 602 provides a vertical etch to remove the top surface of the ultra low-k film while retaining the vertical components of the film on the sidewalls of the gates.

Figure 7:
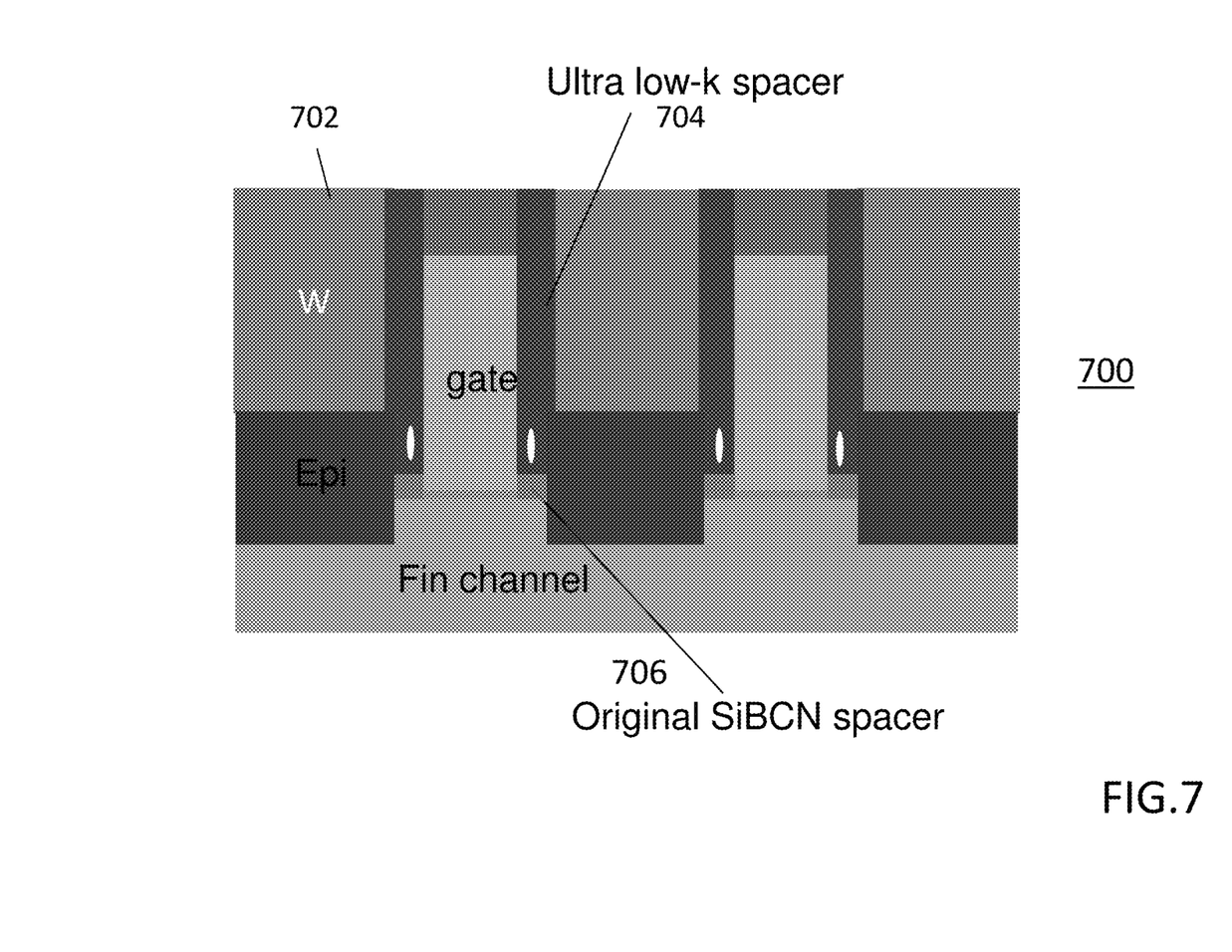
FIG. 7 illustrates a cross-sectional view 700 after tungsten metal deposition 702.

In FIG. 7, tungsten 702 is deposited for the source/drain metal, to be followed by routine planarization, resulting in a finFET structure having ultra low-k spacers 704 with air spacers, as well as portions 706 of the original SiBCN spacer.

Figure 8:
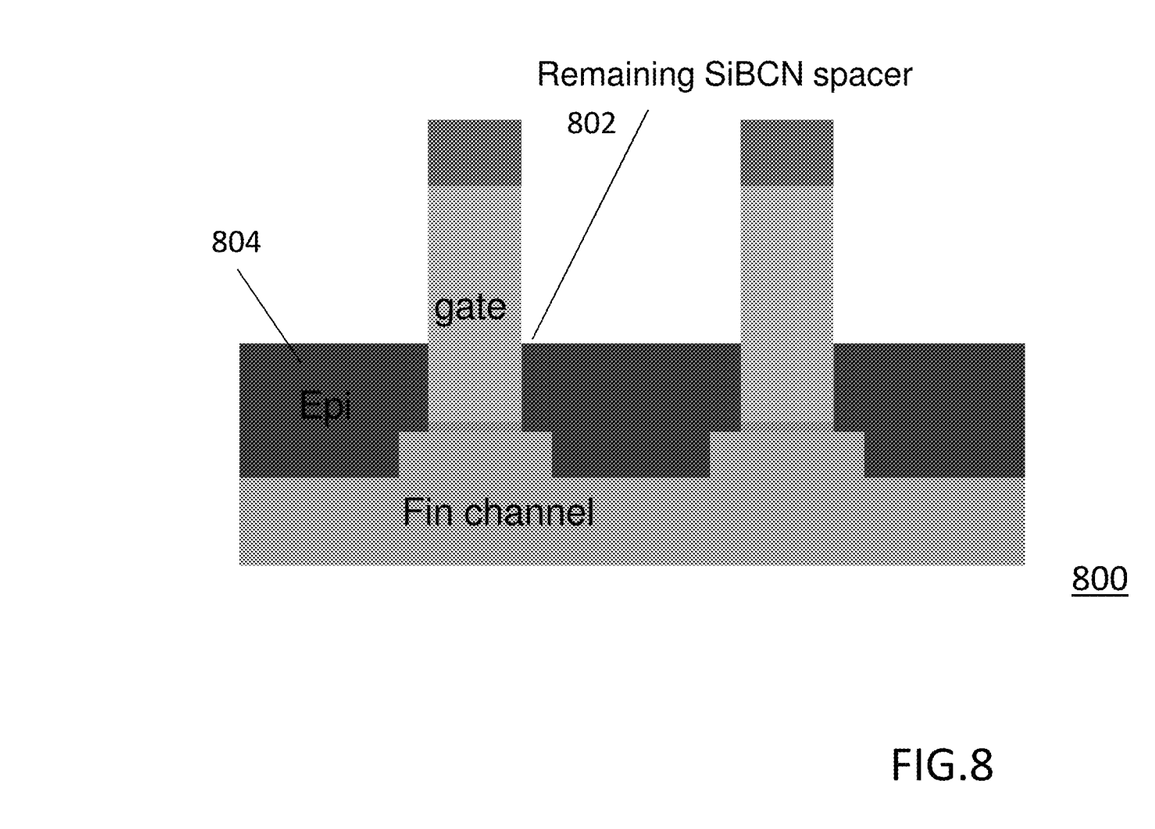
FIG. 8 illustrates a cross-sectional view 800 of a second exemplary embodiment in which the SiBCN spacer 802 is etched only to the level of the surface of the source/drain epi layer 804.

FIG. 8 shows an exemplary second embodiment 800, which differs from the first exemplary embodiment 700 by reason that the SiBCN spacer 802 is not over-etched as in the first embodiment. Thus, in the second embodiment the original underlying SiBCN spacer film is retained to be at the same height as the source/drain epi 804 top surface. As shown in FIG. 8, again, an etch (either isotropic or RIE) is used to remove the original SiBCN spacer layer (see 306, FIG. 3) from the gate structure.

Typically, the exposed SiBCN can first be removed rapidly, which was followed in the first embodiment by an additional etch to additionally remove the SiBCN spacer between the gate and epi layer. Thus, the etch of the original SiBCN spacer film 306 is faster in the second embodiment because no additional etch time is required to over-etch SiBCN film material below the top of the source/drain epi regions. As in the first embodiment, a portion of SiBCN again remains above the fin so that the downstream processes will not damage the gate stack.

Figure 9:
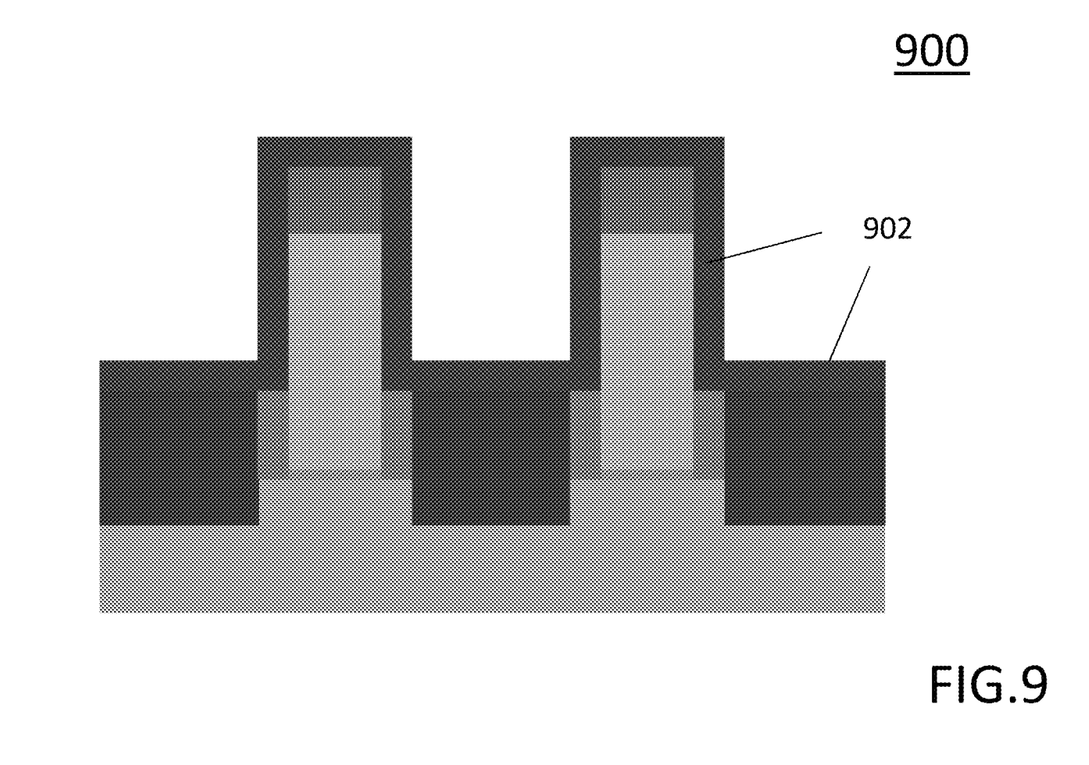
FIG. 9 illustrates a cross-sectional view 900 after deposition of the ultra low-k film 902 in the second embodiment.
Figure 10:
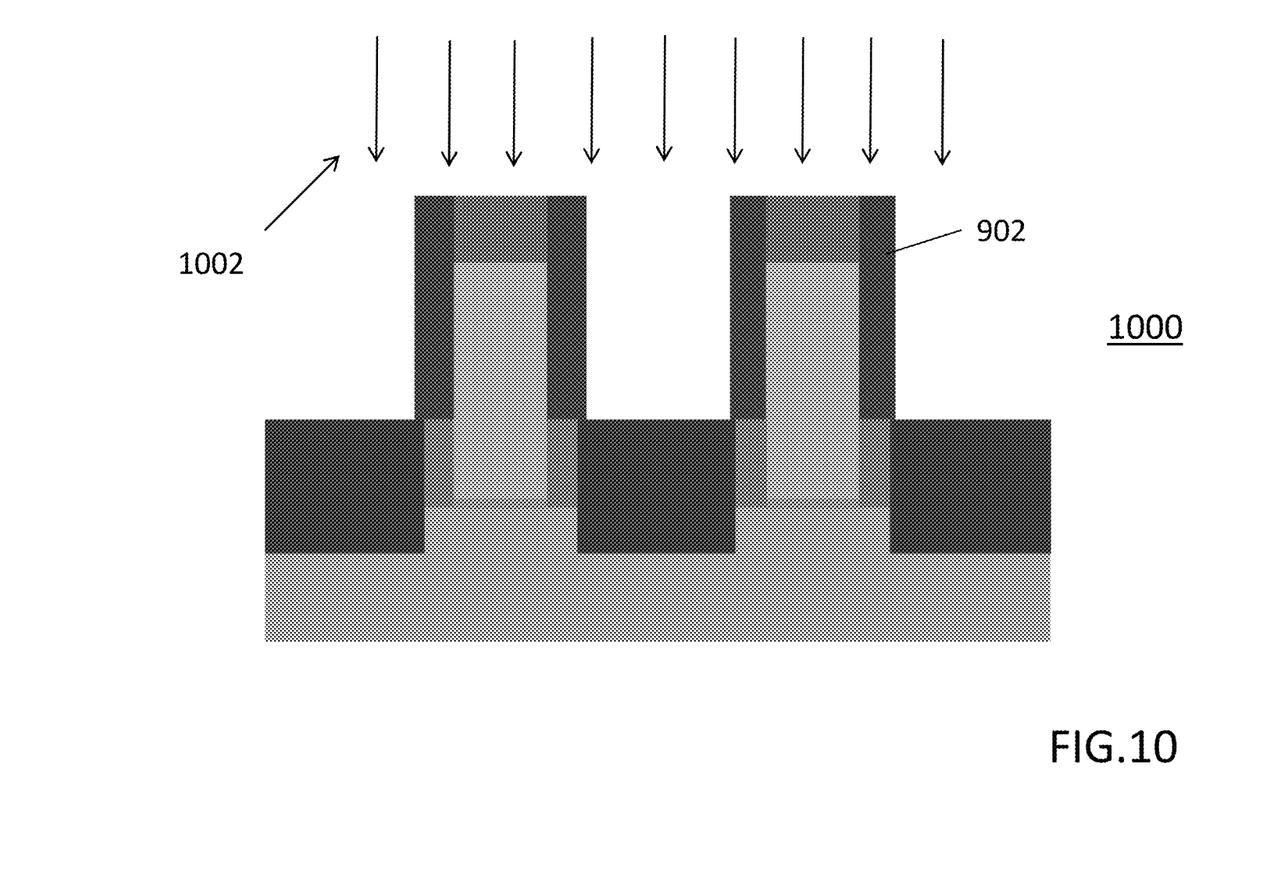
FIG. 10 illustrates a cross-sectional view 1000 after a vertical etch of the ultra low-k film 902 in the second embodiment.
Figure 11:
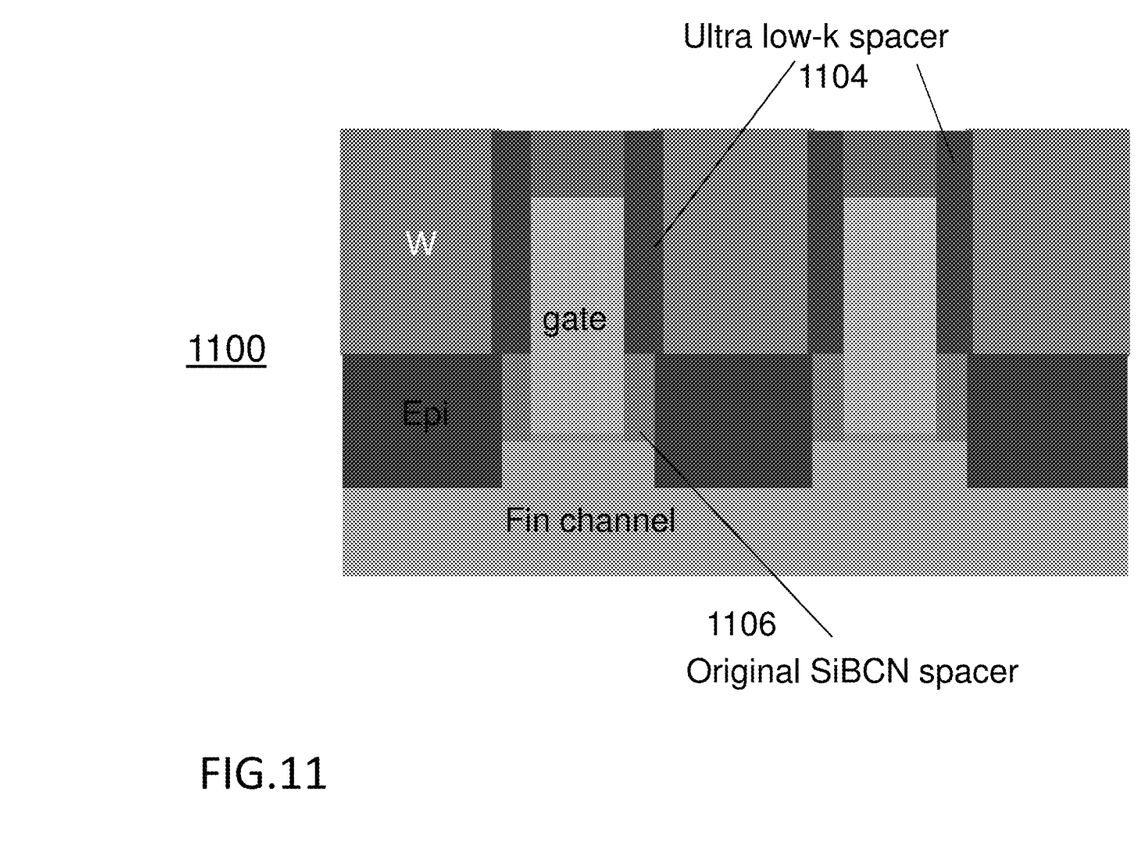
FIG. 11 illustrates a cross-sectional view 1100 after a source/drain contact metal deposition.

FIG. 9 shows the fabrication structure 900 of the second embodiment after the ultra low-k film 902 deposition, and, similar to exemplary embodiment 1, the ultra low-k material 902 can be used because there is no more high thermal budget required. FIG. 10 shows the vertical etch (e.g., RIE 1002) used to remove tops of the ultra low-k film 902 from the top of the gate structures and the source/drain epi areas, leaving ultra low-k film as the vertical sidewall spacers of the gates. FIG. 11 shows the tungsten metal deposition 1102 for the source/drain contacts and further planarization, resulting in the finFET structure 1100 with ultra low-k spacers 1104 and portions 1106 of the original SiBCN spacer material.

In comparing FIG. 7 with FIG. 11, it should be clear that the exemplary second embodiment does not include the air spacer present in the first exemplary embodiment.

In the first exemplary embodiment, the gate spacer comprises the ultra low-k spacer as a top portion, the air gap as a middle portion, and the original SiBCN layer as a bottom portion. In the second exemplary embodiment, the spacer comprises the ultra low-k spacer as a top portion and the original SiBCN spacer layer as a bottom portion. Therefore, because of the low-k effect of the air spacer, the first exemplary embodiment has an advantage of providing a lower parasitic capacitance than that of the second embodiment. However, the first embodiment has the disadvantage that the divot height is not easy to control precisely.

Figure 12:
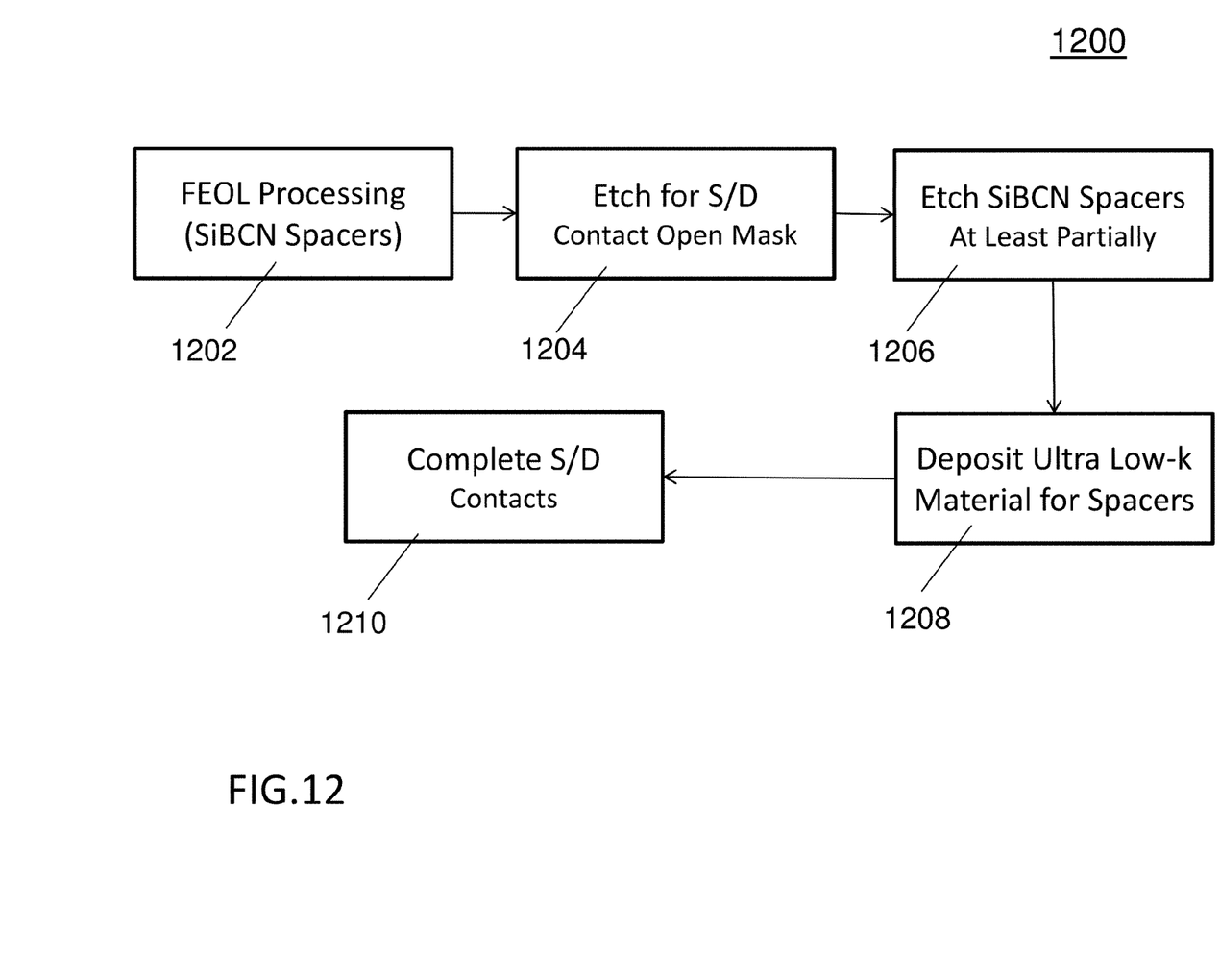
FIG. 12 shows in flowchart format 1200 the method of the invention.

FIG. 12 shows in flowchart format 1200 processing steps related to the two exemplary embodiments. In step 1202, the device is fabricated in the conventional manner for the Front-End-of-Line (FEOL) and Middle-of-Line (MOL) processings, meaning that the fabrication stages for fabricating the pattern of components in the substrate uses conventional FEOL processing and the gate structure fabrication uses conventional MOL processing, including SiBCN material for gate spacers. In step 1204 the conventional S/D Open Mask step etches the oxide layer. In step 1206, the conventional SiBCN spacer is etched partially from the vertical walls of the gate structures, leaving a lower portion to protect against subsequent damage at the gate/channel interface. In step 1208, the ultra low-k material is formed on the vertical gate structure walls, and, in step 1210, the source/drain contacts are completed.

Figure 13:
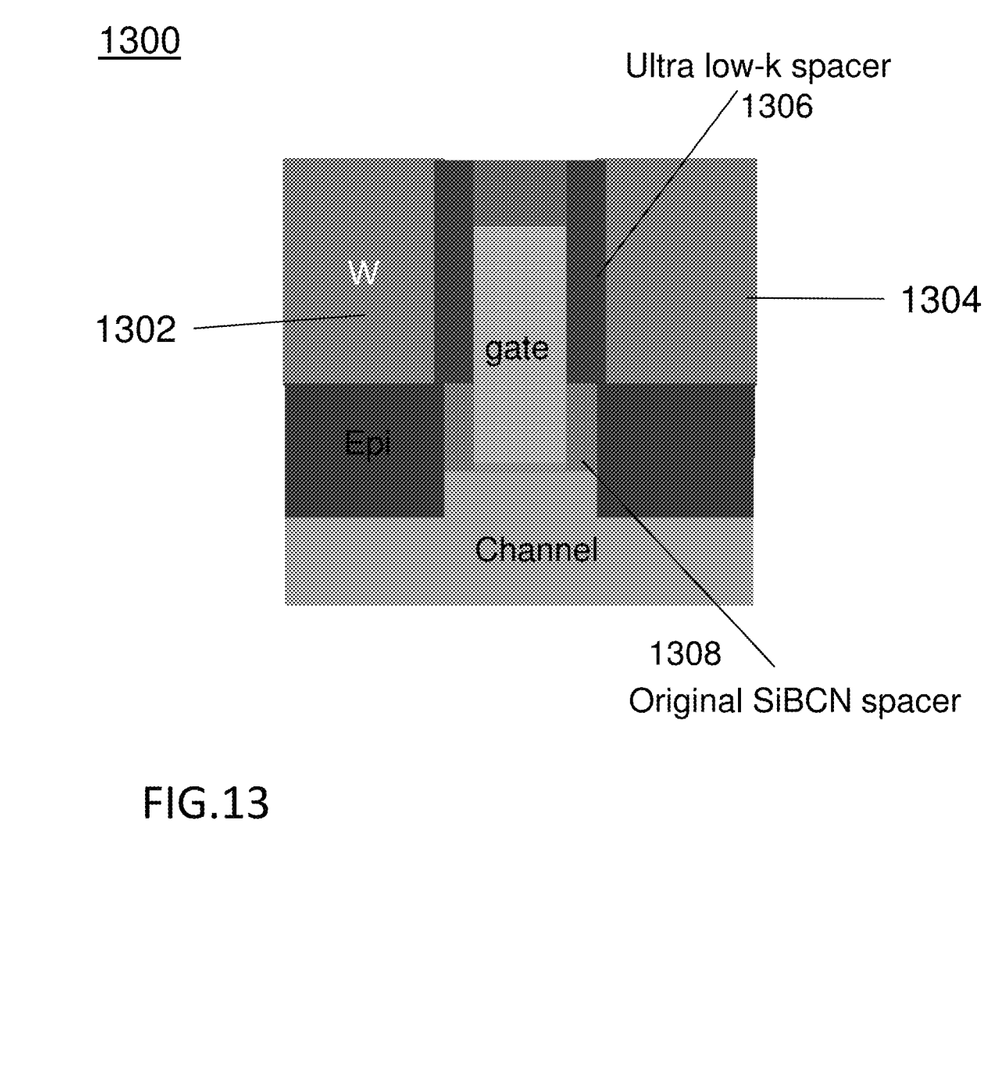
FIG. 13 shows a MOSFET configuration corresponding to an exemplary embodiment described involving finFETs.

FIG. 13 shows a planar MOSFET configuration that exhibits an exemplary embodiment described above, having source/drain 1302, 1304 and an upper portion of ultra low-k spacer material 1306. A portion 1308 remains of the original SiBCN spacer, to protect against damage at the gate/channel interface.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A finFET (fin Field Effect Transistor) comprising:
   a gate structure comprising a gate contact covering a high impedance film layer;
   a fin channel directly under said gate structure such that a movement of carriers is controlled by a voltage in said gate contact;
   a source epitaxial region covered by a source contact metal layer, adjacent to a first side of said gate structure; and
   a drain epitaxial region covered by a drain contact metal layer, adjacent to a second side of said gate structure and opposing said first side,
   wherein said gate structure further comprises a gate sidewall spacer layer, comprising an upper portion and a lower portion, to isolate said gate from said source contact metal layer and said drain contact metal layer,
   wherein said lower portion of said gate sidewall spacer layer comprises a material having a high-k value and said upper portion of said gate sidewall spacer layer comprises a material having an ultra low-k material and a first side surface of the ultra low-k material directly contacts a side surface of a metal layer comprising said gate contact and a second side surface of the ultra low-k material directly contacts one of a side surface of the source contact metal layer or a side surface of the drain contact metal layer along an entirety of a vertical dimension of the side surface of the source contact metal layer or the drain contact metal layer, and wherein a thickness of the upper portion is approximately the same as a thickness of the lower portion; and wherein a height of said lower portion of said gate sidewall spacer layer is lower than a height of said source epitaxial region and a height of said drain epitaxial region such that said gate sidewall spacer layer further comprises a middle portion comprising an air spacer between said gate structure and said source epitaxial region and between said gate structure and said drain epitaxial region, and wherein said air spacer results from having a width of said lower portion being predetermined to provide a high-aspect ratio opening that traps an air gap when said upper portion is formed, the air spacer thereby being below a top surface of said source epitaxial region and below a top surface of said drain epitaxial region.

2. The finFET of claim 1, wherein said lower portion comprises a high-k sidewall spacer layer comprising a SiBCN (Silicon-Boron-Carbon-Nitride) thin film.

3. The finFET of claim 1, wherein said ultra low-k material comprises at least one of:
   SiCOH, a thin film comprising silicon Si, carbon C, oxygen O, and hydrogen H;
   an organosilica glass (OSG);
   a porous xerogel; and
   a mesoporous silica film (MCM).

4. A MOSFET (Metal-Oxide-Semiconductor Field Effect Transistor) comprising:
   a gate structure comprising a gate contact covering a high impedance film layer;
   a channel directly under said gate structure such that a movement of carriers is controlled by a voltage in said gate contact;
   a source epitaxial region covered by a source contact metal layer, adjacent to a first side of said gate structure; and
   a drain epitaxial region covered by a drain contact metal layer, adjacent to a second side of said gate structure and opposing said first side, wherein said gate structure further comprises a gate sidewall spacer layer to isolate said gate from said source contact metal layer and from said drain contact metal layer, wherein said gate sidewall spacer layer comprises an upper portion and a lower portion between said gate structure and said drain contact metal layer and between said gate structure and said source contact metal layer, wherein the upper portion comprises a material having an ultra low-k material, and a first side surface of the ultra low-k material directly contacts a first side surface of a metal comprising said gate contact and a second side surface of the ultra low-k material directly contacts a side surface of one of the source contact metal layer and the drain contact metal layer along an entirety of a vertical dimension of the side surface of the source contact metal layer or the drain contact metal layer, and wherein a thickness of the upper portion is approximately the same as a thickness of the lower portion; and wherein said gate sidewall spacer layer comprises a portion between said gate structure and said source epitaxial region and between said gate structure and said drain epitaxial region with a material having a high-k value wherein said gate sidewall spacer layer further comprises a middle portion comprising an air spacer between said gate structure and said source epitaxial region and between said gate structure and said drain epitaxial region, wherein said air spacer results from having a width of said lower portion being predetermined to provide a high-aspect ratio opening that traps an air gap when said upper portion is formed, the air spacer thereby being below a top surface of said source epitaxial region and below a top surface of said drain epitaxial region.

5. The MOSFET of claim 4, wherein said lower portion comprises a high-k sidewall spacer film comprising a SiBCN (Silicon-Boron-Carbon-Nitride) thin film.

6. The MOSFET of claim 4, wherein said ultra low-k material comprises at least one of:
   SiCOH, a thin film comprising silicon Si, carbon C, oxygen O, and hydrogen H;
   an organosilica glass (OSG);
   a porous xerogel; and
   a mesoporous silica film (MCM).

* * * * *